United States Patent
Li et al.

(10) Patent No.: US 11,024,708 B1
(45) Date of Patent: Jun. 1, 2021

(54) SEMICONDUCTOR DEVICE AND METHOD FOR MANUFACTURING THE SAME

(71) Applicant: INSTITUTE OF MICROELECTRONICS, CHINESE ACADEMY OF SCIENCES, Beijing (CN)

(72) Inventors: Yongliang Li, Beijing (CN); Xiaohong Cheng, Beijing (CN); Qingzhu Zhang, Beijing (CN); Huaxiang Yin, Beijing (CN); Wenwu Wang, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 16/824,761

(22) Filed: Mar. 20, 2020

(30) Foreign Application Priority Data

Nov. 14, 2019 (CN) .......................... 201911112942.8

(51) Int. Cl.
| | |
|---|---|
| *H01L 29/78* | (2006.01) |
| *H01L 29/06* | (2006.01) |
| *H01L 29/417* | (2006.01) |
| *H01L 21/8234* | (2006.01) |
| *H01L 29/66* | (2006.01) |
| *H01L 27/088* | (2006.01) |

(52) U.S. Cl.
CPC ................ *H01L 29/0642* (2013.01); *H01L 21/823431* (2013.01); *H01L 21/823481* (2013.01); *H01L 27/0886* (2013.01); *H01L 29/0653* (2013.01); *H01L 29/41791* (2013.01); *H01L 29/66545* (2013.01); *H01L 29/66795* (2013.01); *H01L 29/785* (2013.01); *H01L 2029/7858* (2013.01)

(58) Field of Classification Search
CPC ....... H01L 21/76232; H01L 21/823431; H01L 21/823481; H01L 27/0886; H01L 29/0642; H01L 29/0649; H01L 29/0653; H01L 29/41791; H01L 29/66545; H01L 29/66795; H01L 29/785; H01L 29/7853; H01L 2029/7858
See application file for complete search history.

(56) References Cited

U.S. PATENT DOCUMENTS

| | | | |
|---|---|---|---|
| 8,809,173 B1 * | 8/2014 | Yin ..................... | H01L 29/1033 438/562 |
| 9,147,616 B1 * | 9/2015 | Jacob .................. | H01L 27/0886 |
| 10,541,253 B2 * | 1/2020 | Cheng ............... | H01L 21/30604 |

(Continued)

*Primary Examiner* — Stephen W Smoot
(74) *Attorney, Agent, or Firm* — Goodwin Procter LLP

(57) ABSTRACT

A semiconductor device, including: a silicon substrate; multiple fin structures, formed on the silicon substrate, where each extends along a first direction; a shallow trench insulator, located among the multiple fin structures; a gate stack, intersecting with the multiple fin structures and extending along a second direction, where first spacers are formed on two sidewalls in the first direction of the gate stack; source-or-drain regions, formed on the multiple fin structures, and located at two sides of the gate stack along the first direction; and a channel region, including a portion of the multiple fin structures located between the first spacers. and notch structures. A notch structure recessed inward is located between each of the multiple fin structures and the silicon substrate. The notch structure includes an isolator that isolates each of the multiple fin structures from the silicon substrate.

18 Claims, 9 Drawing Sheets

(56) References Cited

U.S. PATENT DOCUMENTS

| | | | |
|---|---|---|---|
| 2011/0193178 A1* | 8/2011 | Chang | H01L 29/7853 257/408 |
| 2012/0086053 A1* | 4/2012 | Tseng | H01L 29/7851 257/288 |
| 2013/0320455 A1* | 12/2013 | Cappellani | H01L 29/66795 257/368 |
| 2014/0027783 A1* | 1/2014 | Yin | H01L 21/823821 257/77 |
| 2015/0228480 A1* | 8/2015 | Yin | H01L 29/42392 438/283 |
| 2015/0295010 A1* | 10/2015 | Kim | H01L 29/66621 710/308 |
| 2017/0012124 A1* | 1/2017 | Glass | H01L 29/0649 |
| 2017/0229310 A1* | 8/2017 | Fung | H01L 29/41791 |
| 2017/0229580 A1* | 8/2017 | Lin | H01L 21/32 |
| 2018/0108732 A1* | 4/2018 | Shu | H01L 29/7849 |
| 2018/0175173 A1* | 6/2018 | Chang | H01L 21/3085 |
| 2019/0067284 A1* | 2/2019 | Ching | H01L 21/76229 |
| 2019/0311955 A1* | 10/2019 | Xu | H01L 21/76224 |

* cited by examiner

SEMICONDUCTOR DEVICE AND METHOD FOR MANUFACTURING THE SAME

The present disclosure claims the priority to Chinese Patent Application No. 201911112942.8, titled "SEMICONDUCTOR DEVICE AND METHOD FOR MANUFACTURING THE SAME," filed on Nov. 14, 2019 with the China National Intellectual Property Administration, the content of which is incorporated herein by reference.

FIELD

The present application relates to the technical field of semiconductors, and in particular to a semiconductor device and a method for manufacturing the semiconductor device.

BACKGROUND

As a feature size of a device enters a technology node of 5 nm, a degradation in mobility is caused by a quantum effect, and a saturation effect in strain engineering is caused by continuous miniaturization of the device. Thereby, a performance of the device gradually degrades as the device scaling. Due to high carrier mobility, high mobility channels materials, such as SiGe or Ge, are becoming a hotspot in research of novel three-dimensional devices.

A band gap of a material for high mobility channel, such as Ge, is small. Hence, a leakage is more severe than a silicon-based channel, which degrades the performance of the device.

SUMMARY

In conventional technology, there is a severe leakage current in a device made of a silicon-based channel material or a high-mobility channel material such as Ge. In order to address the above technical issue, a semiconductor device and a method for manufacturing the semiconductor device are provided according to embodiments of the present disclosure.

A semiconductor device is provided, including: a silicon substrate, multiple fin structures, a shallow trench insulator, a gate stack, source-or-drain regions, and a channel region. The multiple fin structures are located on the silicon substrate, and each of the multiple fin structures extends along a first direction. The shallow trench insulator is located among the multiple fin structures. The gate stack intersects with the multiple fin structures, and extends along a second direction. First spacers are located on two sidewalls of the gate stack, and the first spacers are in the first direction of the gate stack. The source-or-drain regions are located on the multiple fin structures, and are located at two sides of the gate stack along the first direction. The channel region includes a portion of the multiple fin structures that is located between the first spacers. A notch structure recessed inward is located between each of the multiple fin structures and the silicon substrate. The notch structure includes an isolator that isolates each of the multiple fin structures from the silicon substrate.

In one embodiment, the isolator is an oxide, where a height of the oxide is larger than 3 nm.

In one embodiment, the semiconductor device is a FinFET (fin field-effect transistor) device. The multiple fin structures are made of $Si_{1-x}Ge_x$, or a stack of $Si_{1-y}Ge_y$ and $Si_{1-z}Ge_z$, where $0 \le x \le 1$, $0.1 \le y \le 0.8$ and $0.3 \le z \le 1$.

In one embodiment, the semiconductor device is a nanowire gate-all-around device or a nanosheet gate-all-around device. The multiple fin structures are made of $Si_{1-x}Ge_x$, where $0 \le x \le 1$.

In one embodiment, the semiconductor device is a nanowire gate-all-around device or a nanosheet gate-all-around device. The multiple fin structures are made of $Si_{1-z}Ge_z$, where $0.3 \le z \le 1$.

In one embodiment, a first fin is located between the silicon substrate and the notch structure, and the first fin is a first strain-buffer structure or a first silicon-etched structure. The first strain-buffer structure is made of $Si_{1-c}Ge_c$, and $0.1 \le c \le 0.8$.

In one embodiment, a second strain-buffer structure or a second silicon-etched structure is located between each of the multiple fin structures and the notch structure. The second strain-buffer structure is made of $Si_{1-d}Ge_d$, and $0.1 \le d \le 0.8$.

A method for manufacturing a semiconductor device is further provided, including: providing a silicon substrate; forming multiple second fins along a first direction on the silicon substrate; etching the silicon substrate to form notch structures; forming an isolator in each of the notch structures, to isolate the multiple second fins from the silicon substrate; forming a shallow trench insulator that covers the silicon substrate, the isolator and the notch structures; planarizing the shallow trench insulator; replacing a part of each of the multiple second fins with a fin structure, where the fin structure is located on a second silicon-etched structure; forming a dummy gate and first spacers along a second direction, on the fin structure, or on the fin structure and the second silicon-etched structure, where the first spacers are on two sides of the dummy gate; etching, at two sides of the first spacers, the fin structure, or the fin structure and the second silicon-etched structure; growing, at the two sides of the first spacers, a source-drain epitaxial layer on the etched fin structure, or on the etched fin structure and the etched second silicon-etched structure, to form source-or-drain regions; replacing the dummy gate with a gate stack, to form the semiconductor device.

In one embodiment, etching the silicon substrate to form the notch structures includes: passivating the multiple second fins with $O_2$ plasma; and etching the silicon substrate through isotropic etching, to form the notch structures.

In one embodiment, etching the silicon substrate to form the notch structures includes: forming second spacers on sidewalls of each of the multiple second fins in the first direction and the second direction; and etching the silicon substrate through isotropic etching, to form the notch structures.

In one embodiment, the silicon substrate is further etched downward to form first fins, after forming the notch structures and before forming the isolator.

In one embodiment, forming the isolator in each of the notch structures includes: oxidizing the multiple second fins, the notch structures, and the first fins in an $O_2$-based atmosphere, where the oxidizing is cycled for one or more times, to form the isolator in each of the notch structures.

In one embodiment, the oxidizing is performed at a temperature ranging from 850° C. to 1150° C. for a period ranging from 15 minutes to 60 minutes, and is cycled for once.

In one embodiment, the oxidizing is performed at a temperature ranging from 800° C. to 1000° C. for a period ranging from 15 seconds to 60 seconds, and is cycled for no more than 5 times.

In one embodiment, replacing the part of each of the multiple second fins with the fin structure includes: planarizing the shallow trench insulator to expose a top of each of the multiple second fins; etching each of the multiple second fins to remove the part of each of the multiple second fins and form the second silicon-etched structure, where the part is smaller than each of the multiple second fins in height; growing a high mobility material in a region of the etched part through selective epitaxy, to form an introduced structure; planarizing the introduced structure, to form an epitaxial structure; and etching the shallow trench insulator, to form the fin structure.

In one embodiment, the high mobility material is $Si_{1-x}Ge_x$, or a stack of $Si_{1-y}Ge_y$ and $Si_{1-z}Ge_z$, where $0 \leq x \leq 1$, $0.1 \leq y \leq 0.8$, and $0.3 \leq z \leq 1$. The epitaxial structure includes a first epitaxial structure, or includes a first epitaxial structure and a second epitaxial structure that is located below the first epitaxial structure.

In one embodiment, replacing the dummy gate with the gate stack includes: depositing an oxide dielectric layer that covers the shallow trench insulator, the second silicon-etched structure, the dummy gate, the first spacers, the source-or-drain regions and the fin structure; planarizing the oxide dielectric layer; removing the dummy gate in a gate region; and forming, in the gate region, a gate dielectric layer and a gate on the gate dielectric layer.

In one embodiment, replacing the dummy gate with the gate stack includes: depositing an oxide dielectric layer that covers the shallow trench insulator, the second silicon-etched structure, the dummy gate, the first spacers, the source-or-drain regions and the fin structure; planarizing the oxide dielectric layer; removing the dummy gate; removing at least one of the second epitaxial structure and the second silicon-etched structure in a gate region, to expose a channel region; and forming, in the channel region, a gate dielectric layer and a gate on the gate dielectric layer.

In summary, the semiconductor device provided according to an embodiment of the present disclosure is a novel structure for a fin field-effect transistor (FinFET) device and a nanowire or nanosheet gate-all-around device, which include high mobility channels. Specifically, an oxide for isolation is formed in the notch structure between the silicon substrate and a silicon-based channel or a high-mobility channel, such as a Ge channel. A leakage current can be reduced while maintaining a high performance, thereby improving capacities of the device.

It is appreciated that the above advantage also applies to the method for manufacturing the semiconductor device according to an embodiment of the present disclosure.

Figure 1:
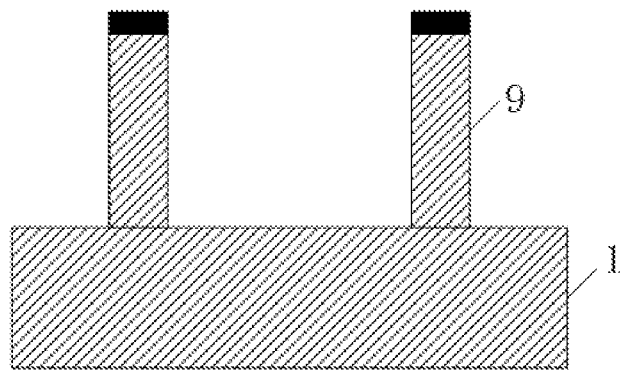
FIGS. 1 to 15 are structural schematic diagrams corresponding to steps in a method for manufacturing a semiconductor device according to an embodiment of the present application.
Figure 2:
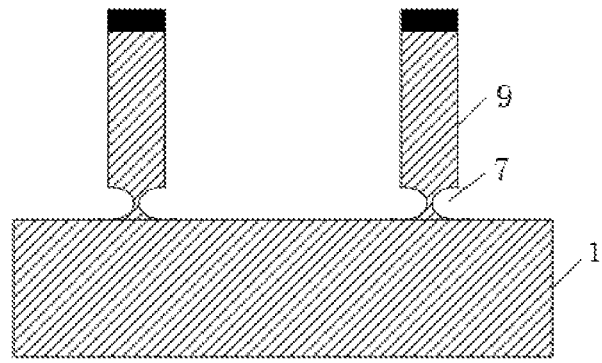

Reference numerals:

| | |
|---|---|
| 1: silicon substrate, | 2: fin structure, |
| 20: first epitaxial structure, | 21: second epitaxial structure, |
| 3: shallow trench insulator, | 4: gate dielectric layer, |
| 5: gate, | 6: channel region, |
| 7: notch structure, | 8: oxide, |
| 9: second fin, | 10: first fin, |
| 11: second spacer, | 12: introduced structure, |
| 13: first spacer, | 14: second silicon-etched structure, |
| 15: second strain-buffer structure. | |

DETAILED DESCRIPTION

Hereinafter embodiments of the present application are illustrated in conjunction with drawings.

Various specific details are set forth as follows for a full understanding of the present disclosure. The present disclosure may further be implemented in embodiments other than what is described herein. Therefore, the present disclosure is not limited by the embodiments disclosed hereinafter.

As a feature size of a device enters a technology node of 5 nm, a degradation in mobility is caused by a quantum effect, and a saturation effect in strain engineering is caused by continuous miniaturization of the device. Thereby, a performance of the device gradually degrades as the device scaling. Due to high carrier mobility, high mobility channels materials, such as SiGe or Ge, are becoming a hotspot in research of novel three-dimensional devices.

A band gap of a material for high mobility channel, such as Ge, is small. Hence, a leakage is more severe than a silicon-based channel, which reduces the performance of the device.

In conventional technology, there is a severe leakage current in a device made of a silicon-based channel material or a high-mobility channel material such as Ge. In order to address the above technical issue, a semiconductor device and a method for manufacturing the semiconductor device are provided according to embodiments of the present disclosure. An oxide for isolation is formed in a notch structure between a silicon substrate and a silicon-based channel or a high-mobility channel, such as a Ge channel. Hence, a leakage current can be reduced while maintaining a high performance, thereby improving capacities of the device.

Reference is made to FIGS. 14 to 20. A semiconductor device according to an embodiment of the present disclosure includes: a silicon substrate 1, multiple fin structures 2, a shallow trench insulator 3, a gate stack, source-or-drain regions, and a channel region 6.

The multiple fin structures 2 are formed on the silicon substrate 1, and extend along a first direction.

The shallow trench insulator 3 is located among the multiple fin structures 2.

The gate stack intersects with the multiple fin structures 2, and extends along a second direction. First spacers 13 are formed on both sidewalls of the gate stack, and the first spacers are in the first direction of the gate stack.

The source-or-drain region are formed on the multiple fin structures 2, and are located at two sides of the gate stack along the first direction.

The channel region 6 includes a portion of the multiple fin structures 2 that is located between the first spacers.

A notch structure 7 recessed inward is provided between each fin structure 2 and the silicon substrate 1. The notch structure 7 includes an insulator that isolates each fin structure 2 from the silicon substrate 1.

In this embodiment, the notch structure 7 may be formed between the fin structure 2 and the silicon substrate 1. The notch structure 7 may be a symmetrical structure in a direction perpendicular to an extending direction of the fin structure 2 in a plane parallel to the substrate, and is recessed inward from both sides. Also, it is appreciated that the notch structure 7 may be an asymmetric structure. The gate stack includes a gate dielectric layer 4, and a gate 5 on the gate dielectric layer 4.

In one embodiment, the isolator may be an oxide 8. A height of the oxide 8 is larger than 3 nm.

In one embodiment, the isolator is an oxide 8. The oxide 8 is formed by oxidizing the notch structure 7 that has been formed. Namely, the notch structure 7 is pinched off through oxidization. Specifically, the whole notch structure 7 may be oxidized to form the oxide 8. Alternatively, only a portion of the notch structure 7 with a small width may be oxidized to form the oxide 8. The height of the oxide 8 for pinching off should be greater than 3 nm, and otherwise the fin structure 2 may not be isolated from the silicon substrate 1. In one embodiment, the height of the oxide 8 is 10 nm.

Figure 14:
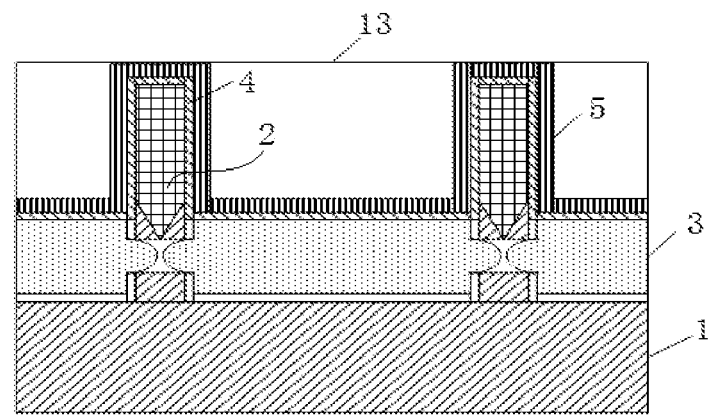
Figure 15:
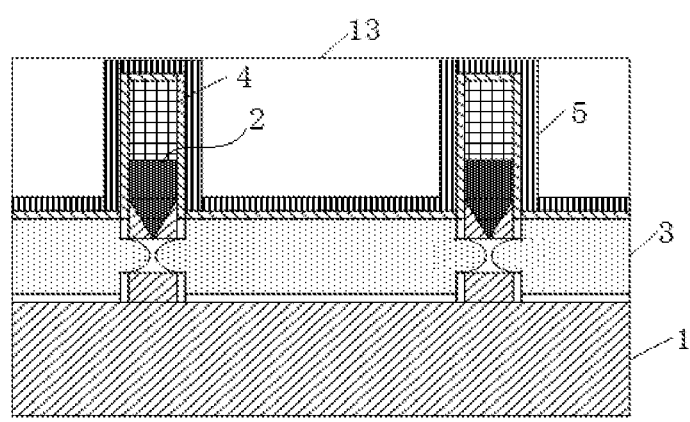

As shown in FIGS. 14 and 15, the semiconductor device is a FinFET (fin field-effect transistor) device. The multiple fin structures 2 are made of $Si_{1-x}Ge_x$, or a stack of $Si_{1-y}Ge_y$ and $Si_{1-z}Ge_z$, and $0 \le x \le 1$, $0.1 \le y \le 0.8$ and $0.3 \le z \le 1$.

Figure 17:
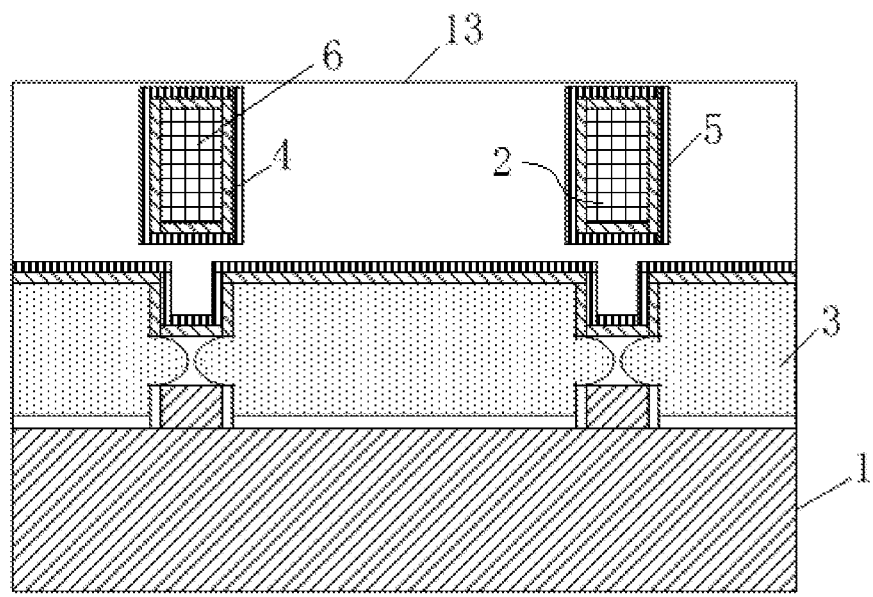
FIGS. 17 to 20 are structural schematic diagrams of cross sections of a nanowire or nanosheet gate-all-around device according to four embodiments of the present application.

As shown in FIG. 17, the semiconductor device is a nanowire gate-all-around device or a nanosheet gate-all-around device. The multiple fin structures 2 are made of $Si_{1-x}Ge_x$, and $0 \le x \le 1$.

Figure 18:
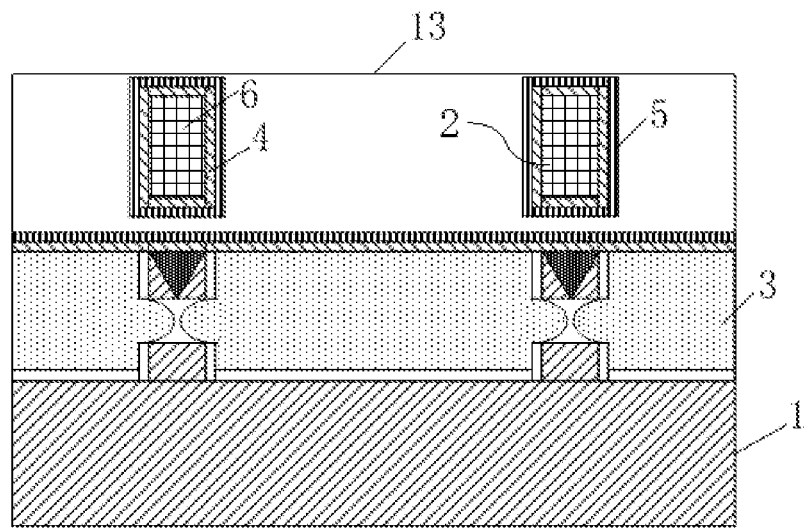
Figure 19:
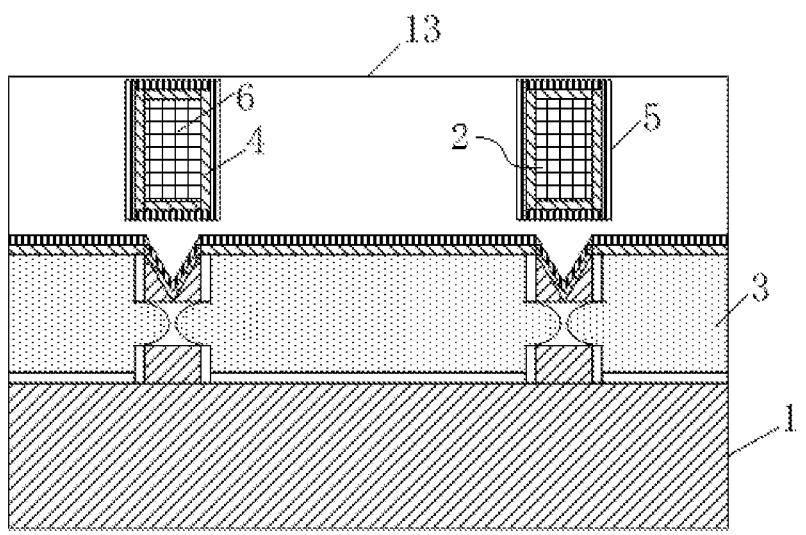

As shown in FIGS. 18 and 19, the semiconductor device is a nanowire gate-all-around device or a nanosheet gate-all-around device. The multiple fin structures 2 are made of $Si_{1-z}Ge_z$, and $0.3 \le z \le 1$.

In these embodiments, the fin structure 2 with an expression of $Si_{1-x}Ge_x$ is made of Si in case of x=0, is made of Ge in case of x=1, and includes Ge of a certain concentration in case of 0<x<1, no matter the semiconductor device is a FinFET device or a nanowire or nanosheet gate-all-around device. Namely, the channel region 6 may be a silicon-based channel, or a high-mobility material channel such as a Ge channel.

In one embodiment, a first fin 10 is located between the silicon substrate 1 and the notch structures 7. The first fin 10 is a first strain-buffer structure or a first silicon-etched structure. The first strain-buffer structure is made of $Si_{1-c}Ge_c$, and $0.1 \le c \le 0.8$.

Hereinafter the semiconductor device is described according to several embodiments of the present application.

First Embodiment

The semiconductor device is a FinFET device, and the FinFET device is manufactured through a shallow-trench-insulation-first (STI first) process. After the silicon substrate 1 is provided, there is no strain-buffer layer formed on the silicon substrate 1. In such case, the notch structure 7 is formed, and then the silicon substrate 1 is further etched downward. The first fin 10, namely, the first silicon-etched structure, is formed between the silicon substrate 1 and the notch structure 7 by etching the silicon substrate 1. A formed structure is as shown in FIG. 14, in a case that $Si_{1-x}Ge_x$ is a sole high mobility material grown through selective epitaxy in a subsequent fin-replacement process. The formed structure is as shown in FIG. 15, in a case that a stack of $Si_{1-x}Ge_x$ and $Si_{1-y}Ge_y$ is the high mobility material grown through selective epitaxy in the subsequent fin-replacement process.

Second Embodiment

Figure 16:
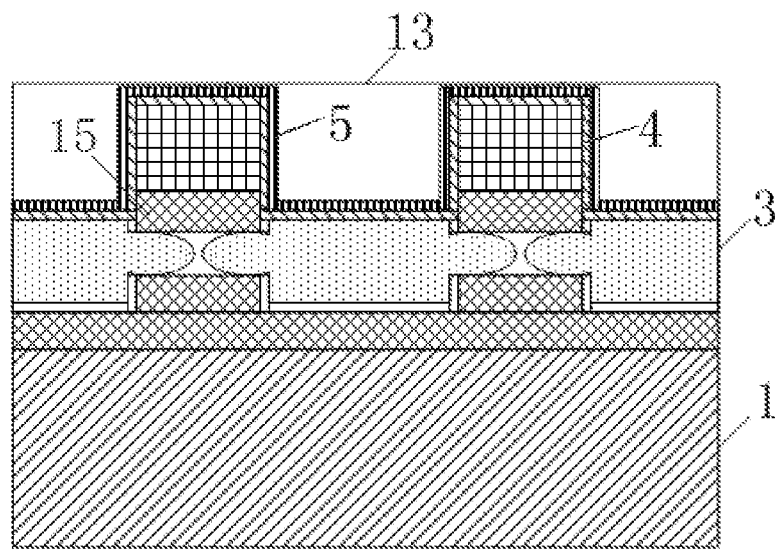
FIG. 16 is a structural schematic diagram of a cross section of a fin field-effect-transistor device according to an embodiment of the present application.

The semiconductor device is a FinFET device as shown in FIG. 16. The second embodiment differs from the first embodiment in that the FinFET device is manufactured through a shallow-trench-insulation-last (STI last) process. After the silicon substrate 1 is provided, a strain-buffer layer is formed on the silicon substrate 1. The notch structure 7 and the first fin 10 are both formed by etching the strain-buffer layer.

Third Embodiment

The semiconductor device is a nanowire gate-all-around device or a nanosheet gate-all-around device, as shown in FIGS. 17 to 19. The nanowire or nanosheet gate-all-around device is manufactured through the STI first process. After the silicon substrate 1 is provided, there is no strain-buffer layer formed on the silicon substrate 1. In such case, the notch structure 7 is formed, and then the silicon substrate 1 is further etched downward. The first fin 10, namely, a first silicon-etched structure, is formed between the silicon substrate 1 and the notch structure 7 by etching the silicon substrate 1.

Fourth Embodiment

Figure 20:
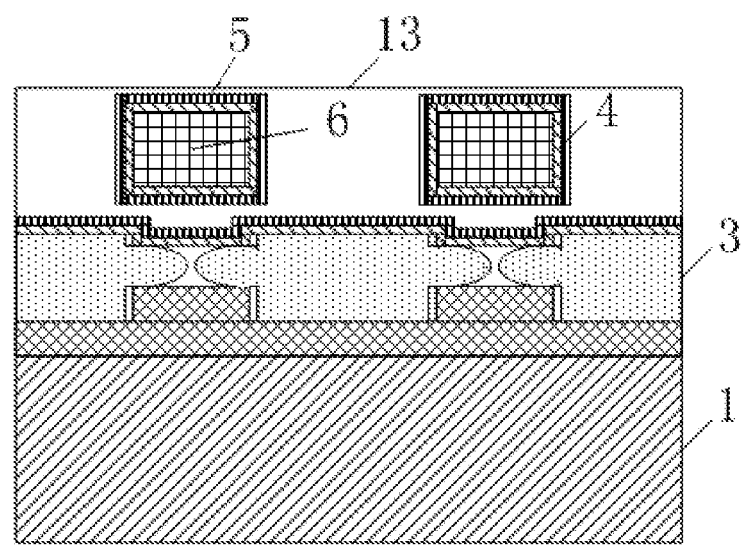

The semiconductor device is a nanowire gate-all-around device or a nanosheet gate-all-around device, as shown in FIG. 20. The fourth embodiment differs from the third embodiment in that the nanowire or nanosheet gate-all-around device is manufactured through the STI last process. After the silicon substrate 1 is provided, a strain-buffer layer is formed on the silicon substrate 1. The notch structure 7 and the first fin 10 are both formed by etching the strain-buffer layer.

It should be noted that both the silicon substrate 1 and the strain-buffer layer may not be etched further downward after the notch structure 7 is formed, regardless of the FinFET device or the nanowire or nanosheet gate-all-around device. In such case, the corresponding first fin 10 is not formed between the substrate 1 and the notch structure 7. That is, there is no first silicon-etched structure or first strain-buffer structure.

Thereby, a second strain-buffer structure 15 or a second silicon-etched structure 14 is located between each fin structure 2 and the notch structure 7. The second strain-buffer structure 15 is made of $Si_{1-d}Ge_d$, and $0.1 \le d \le 0.8$.

The semiconductor devices in the first and third embodiments are manufactured through the STI first process. A height of a replaced part is smaller than a height of a second fin 9 in a subsequent process of fin-replacement, so as to facilitate subsequent growth of the high mobility materials through selective epitaxy. Hence, a part of a second fin 9 remains between the notch structure 7 and the fin structure 2 after a second etching process (which refer to method embodiments as follows). Thereby, the second silicon-etched structure 14 is formed. For the nanowire or nanosheet gate-all-around device in the third embodiment, the second silicon-etched structure 14 may not be removed in releasing the channel region. In such case, the second silicon-etched structure 14 remains between the notch structure 7 and the fin structure 2 when the device is finally formed.

The semiconductor devices in the second and fourth embodiments are manufactured through the STI last process. The strain-buffer layer is formed on the silicon substrate 1 after the silicon substrate 1 is provided. The notch structure 7, and the second strain-buffer structure 15 on the notch structure 7, are formed in a corresponding region of the strain-buffer layer by etching the strain-buffer layer. For the nanowire or nanosheet gate-all-around device described in the fourth embodiment, the second strain-buffer structure 15 may not be completely removed during releasing the channel region. In such case, the second strain-buffer structure 15 remains between the notch structure 7 and the fin structure 2 when the device is finally formed.

According to the above technical solutions, the oxide 8 for isolation is formed in the notch structure 7 between the silicon substrate 1 and the silicon-based channel or a high-mobility channel, such as a Ge channel. A leakage current can be reduced while maintaining a high performance, thereby improving capacities of the device.

Figure 21:
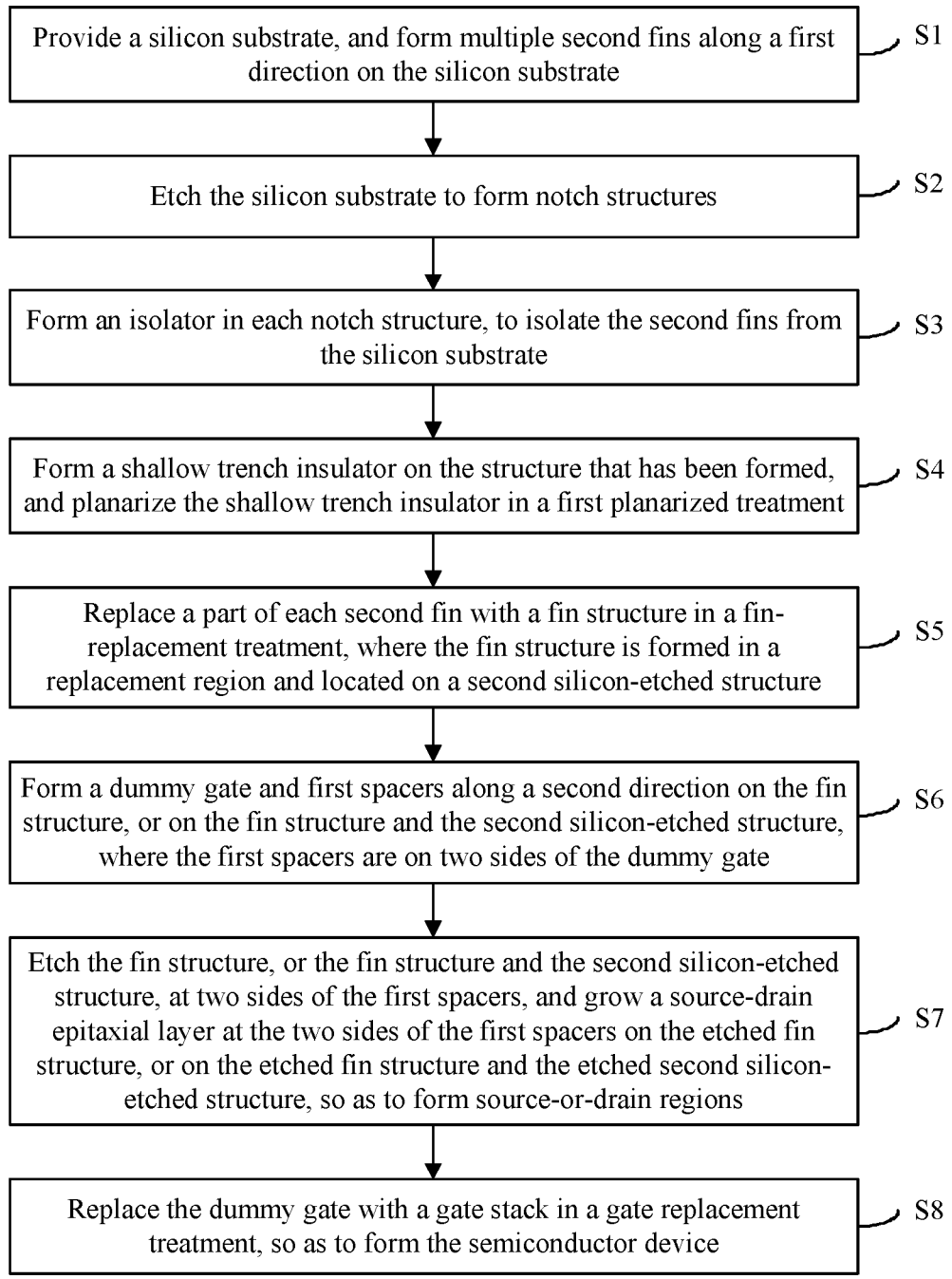
FIG. 21 is a flowchart of a method for manufacturing a semiconductor device according to an embodiment of the present application.

A method for manufacturing a semiconductor device is further provided according to an embodiment of the present application. Reference is made to FIG. 21. The method includes steps S1 to S8.

In step S1, a silicon substrate 1 is provided, and multiple second fins 9 are formed on the silicon substrate 1 along a first direction. Reference is made to FIG. 1.

In this step, the silicon substrate 1 may be etched to a depth corresponding to a top of a notch structure 7, through anisotropic etching by using a hard mask. Thereby, the multiple second fins 9 are formed on the silicon substrate 1 along the first direction. Alternatively, the multiple second fins 9 may be formed on the silicon substrate 1 in another conventional manner.

In step S2, the silicon substrate 1 is etched to form the notch structures 7.

In one embodiment, the step S2 may include steps S211 and S212.

In step S211, the multiple second fins 9 are passivated with $O_2$ plasma.

In this step, the multiple second fins 9 are passivated with $O_2$ plasma passivation, so as to form a protective layer outside each second fin 9. Damages to the second fins 9 are avoided in subsequent etching to form the notch structures 7.

In step S212, the silicon substrate 1 is etched through isotropic etching, to form the notch structures 7.

In this step, the silicon substrate 1 is etched through isotropic etching to form the notch structures 7. A hard mask formed on top of the second fins 9 in the step S1 of etching the silicon substrate may be removed by an HF (hydrofluoric) solution 1, after the notch structures 7 are formed, so as to facilitate subsequent operations.

In another embodiment, the step S2 may include steps S221 and S222.

Figure 5:
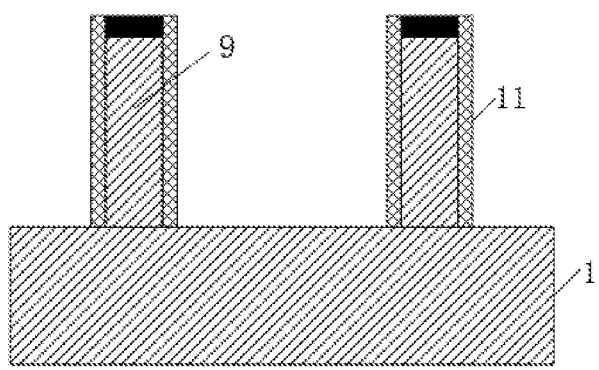

In step S221, second spacers 11 are formed on sidewalls of each second fin 9 in the first direction and a second direction. Reference is made to FIG. 5.

In this step, second spacers 11 are formed on the sidewalls of each second fin 9 in the first direction and the second direction, so as to form a protective layer outside each second fin 9. Damages to the second fins 9 are avoided in subsequent etching to form the notch structures 7. In an embodiment, a second spacer material is deposited on the structure that has been formed, and the second spacers 11 are formed through anisotropic etching. In an embodiment, the second spacers 11 are made of SiN, and a width of a bottom of the second spacers 11 ranges from 5 nm to 20 nm. The second direction may be a direction perpendicular to the first direction, or another direction different from the first direction, in a plane parallel to the silicon substrate.

Figure 6:
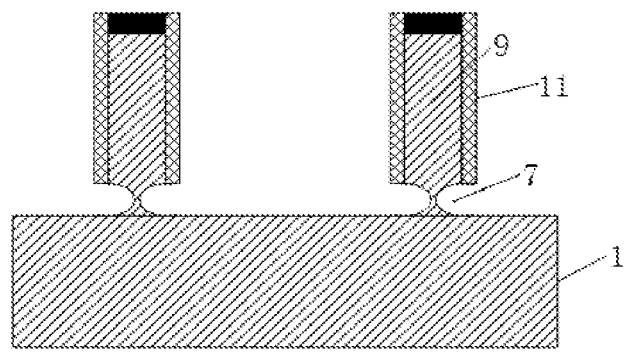

In step S222, the silicon substrate 1 is etched through isotropic etching, to form the notch structures 7. Reference is made to FIG. 6.

In this step, a process of forming the notch structures 7 on the silicon substrate 1 through isotropic etching is basically same as that in the step S212, and is not repeated herein. A difference is that it is necessary to remove the second spacers 11 on the sidewalls of the second fins 9 after the notch structure 7 is formed in this step. In an embodiment, the second spacers 11 are made of SiN, and the second spacers 11 on the sidewalls of the second fins 9 may be removed with a high selection ratio by a $H_3PO_4$ solution.

Figure 3:
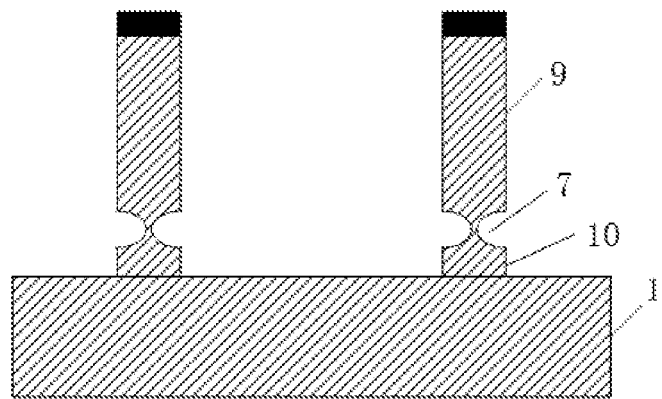
Figure 7:
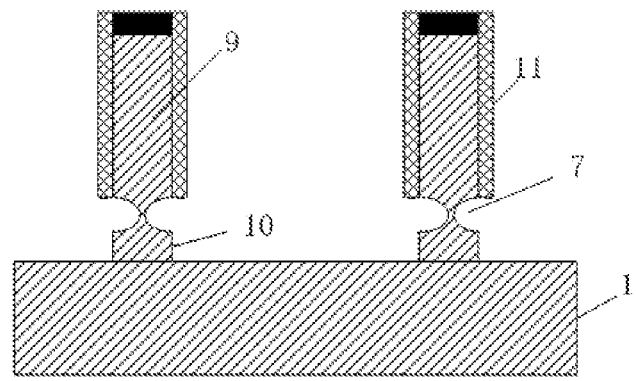

In one embodiment, the silicon substrate 1 is further etched downward to form first fins 10, after the notch structures 7 are formed and before an isolator is formed, namely, after the step S212 or S222 and before step S3. Reference is made to FIGS. 3 and 7.

Figure 4:
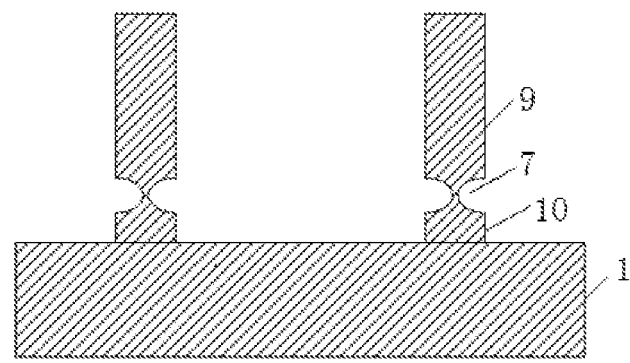

It should be noted that in a case that the first fins 10 are required to be formed on the silicon substrate 1, the first fin 10 should be formed before removing the hard mask on top of the second fin 9 in the step S212, or before removing the second spacers 11 on the sidewalls of the second fins 9 and removing the hard mask on top of the second fin 9 in the step S222. Thereby, it is prevented that the second fins 9 are damaged during etching. The formed structure may refer to FIG. 4.

In step S3, the isolator is formed in each notch structure 7, to isolate the second fins 9 from the silicon substrate 1.

The step S3 may include steps S31 and S32.

In step S31, the multiple second fins 9, the notch structures 7, and the first fins 10 are oxidized in an $O_2$-based atmosphere.

Figure 8:
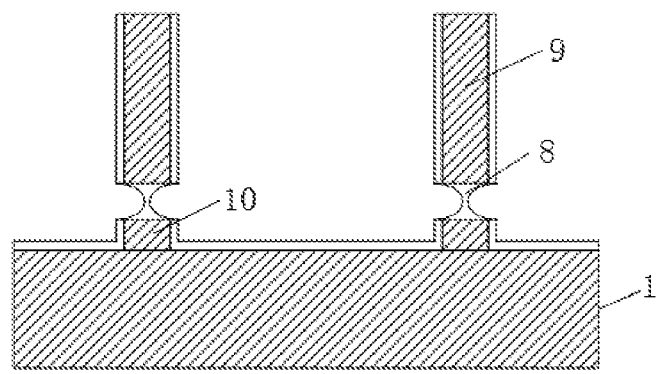

In step S32, the step S31 may be repeated in cycles, to form the isolator in each notch structure 7. Thereby, the second fins 9 are isolated from the silicon substrate 1. The formed structure may refer to FIG. 8.

In steps S31 and S32, oxidization may be performed under a temperature ranging from 850° C. to 1150° C. for a period ranging from 15 minutes to 60 minutes. In such oxidation conditions, the step S31 may be performed once, so as to form an oxide 8 is formed between each second fin 9 and the silicon substrate 1. The second fins 9 are completely isolated from the silicon substrate 1 by the oxide 8 located between the two.

In another embodiment, the oxidation may be performed under a temperature ranging from 800° C. to 1100° C. for a period ranging from 15 seconds to 60 seconds. The step S31 may be performed for 1 to 5 cycles, and a specific quantity of cycles may be set according to a specific situation. The step S31 is cycled until the second fins 9 are completely isolated from the silicon substrate 1 by the oxide 8 located between the two.

It should be noted that only the second fins 9 and the notch structures 7 are required to be oxidized in an $O_2$-based atmosphere in the step S3, in a case that the first fins 10 are not formed on the silicon substrate 1 after the step S212 or S222 and before the step S3.

Figure 9:
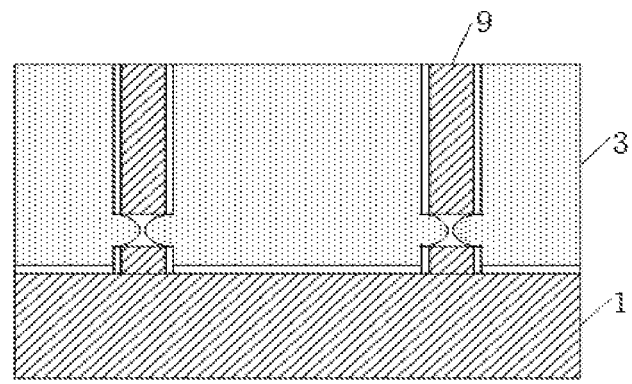

In step S4, a shallow trench insulator 3 is formed on the structure that has been formed, and the shallow trench insulator 3 is planarized in a first planarized treatment. Reference is made to FIG. 9.

In this step, the shallow trench insulator 3 is formed on the structure that has been formed. The shallow trench insulator 3 may be made of SiN, $Si_3N_4$, $SiO_2$ or SiCO. A thickness of the shallow trench insulator 3 should be sufficient to embed the protruding second fins 9. The shallow trench insulator 3 is planarized through chemical mechanical polishing or another other technique, so as to facilitate subsequent processing. Thereby, an etching depth corresponding to each region in the shallow trench insulator 3 is same after the shallow trench insulator 3 is subject to a subsequent first etching treatment.

In step S5, a part of each second fin 9 is replaced with a fin structure 2, in a fin-replacement treatment, where the fin structure 2 is formed in a replacement region and located on a second silicon-etched structure 14.

The step S5 may include steps S51 to S53.

In step S51, the shallow trench insulator 3 is planarized or etched in a first etching treatment, to expose a top of each second fin 9.

In this step, the shallow trench insulator 3 may be planarized or etched by a DHF (diluted hydrofluoric) solution or a BOE (buffered oxide etch) solution. A height of the exposed top of each second fin 9 may be set according to a specific situation.

Figure 10:
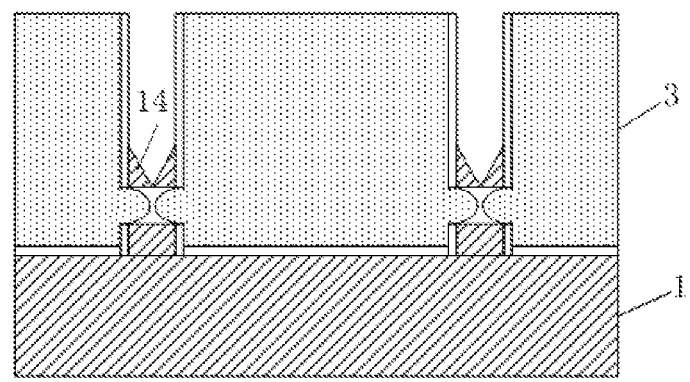

In step S52, each second fin 9 is etched in a second etching treatment, to remove the part of each second fin 9 in the replacement region and form a second silicon-etched structure 14. The part in the replacement region is less than each second fin in height. Reference is made to FIG. 10.

In this step, the second fins 9 are etched by a TMAH (Tetramethylammonium hydroxide) solution, to remove the part of the second fin 9 in the replacement region. The height of part in the replacement region is smaller than the height of the second fin 9. Namely, only a portion of each second fin 9 is removed in height, when the second fins 9 is etched by the TMAH solution in the second etching treatment. The remained second fin 9 forms a second silicon-etched structure 14. A specific height of the removed part in each second fin 9 may be set according to a specific situation, and is not specifically limited herein.

In another embodiment, the second fins 9 may be etched through dry etching in the second etching treatment. For example, the second fins 9 may be etched by a HCl gas in the second etching treatment. A V-shaped morphology is formed in case of the TMAH solution being applied in the second etching treatment using, while a smoother interface is formed in case of dry etch is applied in the second etching treatment, such as using the HCl gas.

Figure 11:
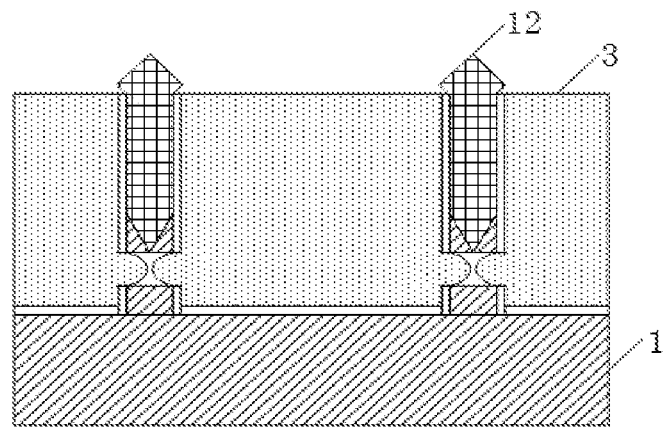

In step S53, a high-mobility material is grown through selective epitaxy in the replacement region to form an introduced structure 12, and the introduced structure 12 is planarized in a second planarization treatment to form an epitaxial structure. Reference is made to FIG. 11.

In this step, the high mobility material may be in the replacement region through selective epitaxy, such as reduced-pressure epitaxy. In an embodiment, the high mobility material is $Si_{1-x}Ge_x$, and $0 \leq x \leq 1$. In an embodiment, there is $0.25 < x \leq 0.5$. In such cases, the formed epitaxial structure only includes a first epitaxial structure 20.

Alternatively, the high mobility material may be a stack of $Si_{1-y}Ge_y$ and $Si_{1-z}Ge_z$, $0.1 \leq y \leq 0.8$, and $0.3 \leq z \leq 1$. In an embodiment, there is $0.3 \leq y \leq 0.75$. In such cases, the formed epitaxial structure includes the first epitaxial structure 20 made of $Si_{1-z}Ge_z$ and the second epitaxial structure 21 made of $Si_{1-y}Ge_y$. The second epitaxial structure 21 is located under the first epitaxial structure 20. The second epitaxial structure $Si_{1-y}Ge_y$ may mitigate a stress on the channel region, and Ge of a higher concentration may be incorporated in the selective epitaxy of the first epitaxial structure 20 in comparison with directly growing the first epitaxial structure 20 on the silicon substrate 1. Thereby, carrier mobility and a performance of the semiconductor device are further improved. Thicknesses of the $Si_{1-y}Ge_y$ and $Si_{1-z}Ge_z$ in the stack may be set respectively, according to a specific situation. The first epitaxial structure 20 and the second epitaxial structure 21 may be grown through synchronous epitaxy or asynchronous epitaxy.

In one embodiment, growth of the high mobility material continues in the selective epitaxy, when a growth height of the high mobility material is higher than a trench depth of the replacement region. In such case, a boundary of the high mobility material is no longer restricted, and a shape of growth goes irregular. It is necessary to planarize the introduced structure 12 to a top of the shallow trench insulator 3 in a second planarization treatment, so as to facilitate subsequent processing. A technique such as chemical mechanical polishing is applied in the second planarization treatment. Thereby, the epitaxial structure formed in the replacement region is high in mobility and regular in shape.

Figure 12:
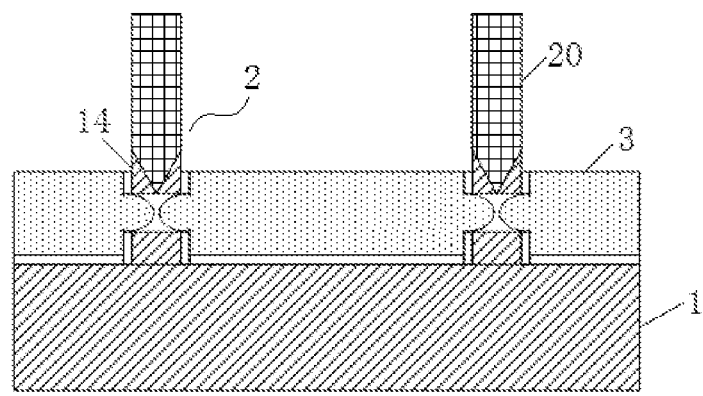
Figure 13:
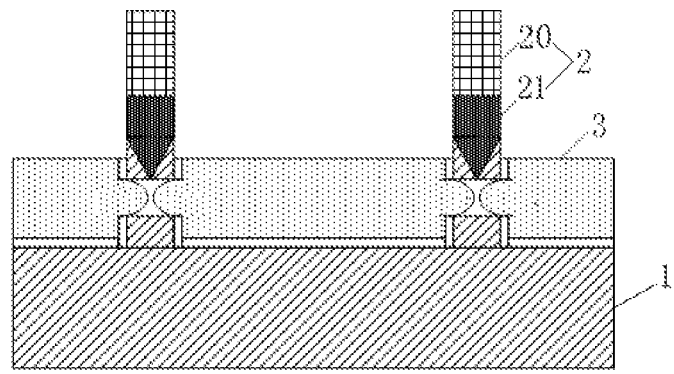

In step S54, the shallow trench insulator 3 is etched in a third etching treatment, so as to form a fin structure 2. Reference is made to FIGS. 12 and 13.

In this step, the shallow trench insulator 3 may be etched in the third etching treatment by a DHF solution or a BOE solution, so as to expose a part or the whole epitaxial structure in height. Thereby, the fin structure 2 is formed to facilitate subsequent processing in manufacturing the device. A height of the epitaxial structure exposed after the third etching treatment may be can be set according to a practical situation.

In one embodiment, the epitaxial structure only includes the first epitaxial structure 20 in a case that the high mobility material grown through selective epitaxy is solely $Si_{1-x}Ge_x$. The epitaxial structure includes the first epitaxial structure 20, and the second epitaxial structure 21 located below the first epitaxial structure 20, in a case that the high mobility material grown through selective epitaxy is a stack of $Si_{1-y}Ge_y$ and $Si_{1-z}Ge_z$.

It should be noted that, after the fin replacing treatment, the shallow trench insulator 3 is etched by a larger depth in the third etching treatment for the nanowire or nanosheet gate-all-around device than for the FinFET device. In an embodiment, the top of the shallow trench insulator 3 after the third etching treatment should be lower than a top of the second silicon-etched structure 14, in a case that the epitaxial structure grown through the selective epitaxy only includes the first epitaxial structure 20.

The top of the shallow trench insulator 3 after the third etching treatment should be lower than the top of the second epitaxial structure 21, in a case that the epitaxial structure grown through the selective epitaxy includes the first epitaxial structure 20 and the second epitaxial structure 21.

In step S6, a dummy gate and first spacers 13 are formed along a second direction on the fin structure 2, or on the fin structure 2 and the second silicon-etched structure 14. The first spacers 13 are on two sides of the dummy gate.

In this step, a gate material of the dummy gate is formed along the second direction on the fin structure 2, in a case that the second silicon-etched structure 14 is not exposed after the shallow trench insulator 3 is etched in the third etching treatment. The gate material of the dummy gate is deposited along the second direction on both the second silicon-etched structure 14 and the fin structure 2, in a case that the second silicon-etched structure 14 is exposed after the shallow trench insulator 3 is etched in the third etching treatment. The dummy gates may be made of polysilicon or amorphous silicon. Then, the gate material can be etched through wet etching or dry etching, so as to form the dummy gates. Afterwards, a material of the first spacers 13 is deposited, and then etched through wet etching or dry etching to form the first spacers 13.

In step S7, the fin structure 2, or the fin structure 2 and the second silicon-etched structure 14 are etched at two sides of the first spacers 13, and a source-drain epitaxial layer is grown at the two sides of the first spacers on the etched fin structure 2, or on the etched fin structure 2 and the etched second silicon-etched structure 14, to form source-or-drain regions.

In this step, the fin structure 2, or the fin structure 2 and the second silicon-etched structure 14 are firstly etched at two sides of the dummy gate to form recessed regions. Then, the source-drain material is grown in the recessed regions at the two sides of the dummy gate, so as to form the source-or-drain regions.

It should be noted that the epitaxial structure grown through the selective epitaxy may include the first epitaxial structure 20 and the second epitaxial structure 21 for the nanowire or nanosheet gate-all-around device. In such case, the dummy gate, and the first spacers 13 on the two sides of the dummy gate, should be further formed on the second epitaxial structure 21 in the step S6. In the step 7, the second epitaxial structure 21 should be further etched at the two sides of the first spacer 13, and the source-or-drain epitaxial layer should be grown at the two sides of the first spacer 13 further on the etched second epitaxial structure 21, so as to form the source-or-drain regions.

In step S8, the dummy gate is replaced with a gate stack in a gate replacement treatment, so as to form the semiconductor device.

In one embodiment, the semiconductor device is the FinFET device, and the step S8 may include steps S811 to S813.

In step S811, an oxide dielectric layer is deposited on the structure that has been formed, and the oxide dielectric layer is planarized in a third planarization treatment.

In this step, the oxide dielectric layer is deposited on the formed structure. The oxide dielectric layer may be made of $SiO_2$, and a thickness of the oxide dielectric layer should be sufficient to embed the protruding dummy gate. The oxide dielectric layer is planarized in the third planarization process after being deposited, so as to expose a top of the dummy gate.

In step S812, the dummy gate is removed in a gate region.

In this step, the dummy gate is removed through dry etching or wet etching.

In step S813, a gate dielectric layer 4 and a gate 5 on the gate dielectric layer 4 are formed. Reference is made to FIGS. 14 and 15.

In this step, the gate dielectric layer 4 is deposited in the gate region after the dummy gate is removed. In an embodiment, the gate dielectric layer 4 is a layer with a high dielectric constant. For example, the layer with a high dielectric constant may be made of materials with a high dielectric constant, such as $HfO_2$ (hafnium dioxide), $ZrO_2$ (zirconium dioxide), $TiO_2$ (titanium dioxide) or $Al_2O_3$ (aluminum trioxide). The gate 5 is formed on the gate dielectric layer 4 after the above deposition. The gate 5 may be a stack of one or more materials that meet a requirement, such as TaN (tantalum nitride), TiN (titanium nitride), TiAlC (carbon aluminum titanium). Thicknesses of the gate dielectric layer 4 and the gate electrode 5 may be set respectively, according to a specific situation.

In another embodiment, the semiconductor device is a nanowire or nanosheet gate-all-around device, and the step S8 may include steps S821 to S823.

In step S821, an oxide dielectric layer is deposited on the structure that has been formed, and the oxide dielectric layer is planarized in a third planarization treatment.

This step is basically same as the step S811, and is not repeated herein.

In the S822, the dummy gate is removed, and at least one of the second epitaxial structure 21 and the second silicon-etched structure 14 are removed in a gate region, so as to form a channel region 6.

In this step, the second silicon-etched structure 14 in the gate region is further removed after removing the dummy gate through dry etching or wet etching, so as to form the channel region 6, in a case that the high mobility material grown in the replacement region through the selective epitaxy is solely $Si_{1-x}Ge_x$.

The second silicon-etched structure 14 and the second epitaxial structure $Si_{1-y}Ge_y$ 21, or only the second epitaxial structure $Si_{1-y}Ge_y$ 21, in the gate region are required to be further removed after removing the dummy gate, so as to form the channel region 6, in a case that the high mobility material grown in the replacement region through the selective epitaxy is a stack of $Si_{1-y}Ge_y$ and $Si_{1-z}Ge_z$.

In the aforementioned embodiments, only a part of the second epitaxial structure 21 and/or a part of the second silicon-etched structure 14 may be necessary to be removed in the gate region in the step S822. Reference is made to FIGS. 18 and 19. It is not necessary to remove the whole second epitaxial structure 21 and the whole second silicon-etched structure 14, as long as the channel region 6 is released and there is no corresponding residue in the channel region 6 and the source-or-drain regions, thereby not affecting subsequent manufacture of the gate dielectric layer 4 and the gate 5. The remained second epitaxial structure 21 and/or the second silicon-etched structure 14 may be doped before forming the gate dielectric layer 4 and the gate 5. Thereby, it is prevented that a parasitic-channel phenomenon in subsequent processing affects a performance of the device.

In step S823, a gate dielectric layer 4 and a gate 5 on the gate dielectric layer 4 are formed in the channel region 6. Reference is made to FIGS. 17 to 19.

In this step, the gate dielectric layer 4 and the gate 5 are sequentially formed in the channel region 6. Materials of the gate dielectric layer 4 and the gate 5 may refer to the materials mentioned in the step S813. The step S823 differs from the step S813 in that the channel region 6 is surrounded by the gate dielectric layer 4 and the gate 5 that are sequentially formed surround, so as to form the nanowire or nanosheet gate-all-around device.

In summary, the aforementioned method for manufacturing the semiconductor device is based on the STI first process according to an embodiment the present application.

The method has the same advantages as the aforementioned semiconductor device. Namely, the oxide 8 in the notch structure 7 is applied to isolate the silicon substrate from the silicon-based channel or the high-mobility channel, such as the Ge channel. A leakage current can be reduced while maintaining a high performance.

As described above, the above embodiments are only intended to describe the technical solutions of the present disclosure, and not to limit the present disclosure. Although the present disclosure is described in detail with reference to the above embodiments, those skilled in the art should understand that, modifications can be made to the technical solutions recorded in the above embodiments, or equivalent replacements can be made to some of the technical features thereof, and the modifications and the replacements will not make the corresponding technical solutions deviate from the spirit and the scope of the technical solutions of the embodiments of the present disclosure.

The invention claimed is:

1. A semiconductor device, comprising:
 a silicon substrate;
 a plurality of fin structures, located on the silicon substrate, wherein each of the plurality of fin structures extends along a first direction;
 shallow trench insulator, located among the plurality of fin structures;
 a gate stack, intersecting with the plurality of fin structures, wherein the gate stack extends along a second direction, first spacers are located on two sidewalls of the gate stack, and the first spacers are in the first direction of the gate stack;
 source-or-drain regions, located on the plurality of fin structures, wherein the source-or-drain regions are located at two sides of the gate stack along the first direction; and
 a channel region, comprising a portion of the plurality of fin structures located between the first spacers;
 wherein a notch structure recessed inward is located between each of the plurality of fin structures and the silicon substrate; and
 wherein the notch structure comprises an isolator that isolates each of the plurality of fin structures from the silicon substrate.

2. The semiconductor device according to claim 1, wherein the isolator is an oxide, and a height of the oxide is larger than 3 nm.

3. The semiconductor device according to claim 1, wherein:
 the semiconductor device is a FinFET (fin field-effect transistor) device; and
 the plurality of fin structures is made of $Si_{1-x}Ge_x$, or a stack of $Si_{1-y}Ge_y$ and $Si_{1-z}Ge_z$, wherein $0 \leq x \leq 1$, $0.1 \leq y \leq 0.8$ and $0.3 \leq z \leq 1$.

4. The semiconductor device according to claim 1, wherein:
 the semiconductor device is a nanowire gate-all-around device or a nanosheet gate-all-around device; and
 the plurality of fin structures is made of $Si_{1-x}Ge_x$, wherein $0 \leq x \leq 1$.

5. The semiconductor device according to claim 1, wherein:
 the semiconductor device is a nanowire gate-all-around device or a nanosheet gate-all-around device; and
 the plurality of fin structures is made of $Si_{1-z}Ge_z$, wherein $0.3 \leq z \leq 1$.

6. The semiconductor device according to claim 1, wherein:
 a first fin is located between the silicon substrate and the notch structure, and
 the first fin is a first strain-buffer structure or a first silicon-etched structure, wherein the first strain-buffer structure is made of $Si_{1-c}Ge_c$, and $0.1 \leq c \leq 0.8$.

7. The semiconductor device according to claim 1, wherein:
 a second strain-buffer structure or a second silicon-etched structure is located between each of the plurality of fin structures and the notch structure; and
 the second strain-buffer structure is made of $Si_{1-d}Ge_d$, wherein $0.1 \leq d \leq 0.8$.

8. A method for manufacturing a semiconductor device, comprising the following steps:
 providing a silicon substrate;
 forming a plurality of second fins along a first direction on the silicon substrate;
 etching the silicon substrate to form notch structures;
 forming an isolator in each of the notch structures, to isolate the plurality of second fins from the silicon substrate;
 forming a shallow trench insulator that covers the silicon substrate, the isolator and the notch structures;
 planarizing the shallow trench insulator;
 replacing a part of each of the plurality of second fins with a fin structure, wherein the fin structure is located on a second silicon-etched structure;
 forming a dummy gate and first spacers along a second direction, on the fin structure, or on the fin structure and the second silicon-etched structure, wherein the first spacers are on two sides of the dummy gate;
 etching, at two sides of the first spacers, the fin structure, or the fin structure and the second silicon-etched structure;
 growing, at the two sides of the first spacers, a source-drain epitaxial layer on the etched fin structure, or on the etched fin structure and the etched second silicon-etched structure, to form source-or-drain regions; and
 replacing the dummy gate with a gate stack, to form the semiconductor device.

9. The method according to claim 8, wherein etching the silicon substrate to form the notch structures comprises:
 passivating the plurality of second fins with $O_2$ plasma; and
 etching the silicon substrate through isotropic etching, to form the notch structures.

10. The method according to claim 8, wherein etching the silicon substrate to form the notch structures comprises:
 forming second spacers on sidewalls of each of the plurality of second fins in the first direction and the second direction; and
 etching the silicon substrate through isotropic etching, to form the notch structures.

11. The method according to claim 8, wherein the silicon substrate is further etched downward to form first fins, after forming the notch structures and before forming the isolator.

12. The method according to claim 11, wherein forming the isolator in each of the notch structures comprises:
 oxidizing the plurality of second fins, the notch structures, and the first fins in an $O_2$-based atmosphere;
 wherein the oxidizing is cycled for one or more times, to form the isolator in each of the notch structures.

13. The method according to claim 12, wherein the oxidizing is performed at a temperature ranging from 850° C. to 1150° C. for a period ranging from 15 minutes to 60 minutes, and is cycled for once.

14. The method according to claim 12, wherein the oxidizing is performed at a temperature ranging from 800° C. to 1000° C. for a period ranging from 15 seconds to 60 seconds, and is cycled for no more than 5 times.

15. The method according to claim 8, wherein replacing the part of each of the plurality of second fins with the fin structure comprises:
 planarizing the shallow trench insulator to expose a top of each of the plurality of second fins;
 etching each of the plurality of second fins, to remove the part of each of the plurality of second fins and form the second silicon-etched structure, wherein the part is smaller than each of the plurality of second fins in height;

growing a high mobility material in a region of the etched part through selective epitaxy, to form an introduced structure;

planarizing the introduced structure, to form an epitaxial structure; and etching the shallow trench insulator, to form the fin structure.

16. The method according to claim 15, wherein:

the high mobility material is $Si_{1-x}Ge_x$, or a stack of $Si_{1-y}Ge_y$ and $Si_{1-z}Ge_z$, wherein $0 \leq x \leq 1$, $0.1 \leq y \leq 0.8$, and $0.3 \leq z \leq 1$; and the epitaxial structure comprises a first epitaxial structure, or comprises a first epitaxial structure and a second epitaxial structure that is located below the first epitaxial structure.

17. The method for manufacturing the semiconductor device according to claim 16, wherein the step of performing the gate replacing process comprises:

depositing an oxide dielectric layer that covers the shallow trench insulator, the second silicon-etched structure, the dummy gate, the first spacers, the source-or-drain regions and the fin structure;

planarizing the oxide dielectric layer;

removing the dummy gate;

removing at least one of the second epitaxial structure and the second silicon-etched structure in a gate region, to expose a channel region; and forming, in the channel region, a gate dielectric layer and a gate on the gate dielectric layer.

18. The method according to claim 8, wherein replacing the dummy gate with the gate stack comprises:

depositing an oxide dielectric layer that covers the shallow trench insulator, the second silicon-etched structure, the dummy gate, the first spacers, the source-or-drain regions and the fin structure;

planarizing the oxide dielectric layer;

removing the dummy gate in a gate region; and forming, in the gate region, a gate dielectric layer and a gate on the gate dielectric layer.

* * * * *